US010331227B2

(12) United States Patent
Tsiopanos et al.

(10) Patent No.: US 10,331,227 B2
(45) Date of Patent: Jun. 25, 2019

(54) INPUT DEVICE ON TRIGGER MECHANISM FOR MOBILE DEVICE

(71) Applicant: Symbol Technologies, Inc., Schaumburg, IL (US)

(72) Inventors: Konstantinos D. Tsiopanos, Selden, NY (US); Jaeho Choi, Whitestone, NY (US); Ian R. Jenkins, Stony Brook, NY (US); Richard M. Martin, New Hyde Park, NY (US); Chandra M. Nair, Mount Sinai, NY (US)

(73) Assignee: Symbol Technologies, LLC, Holtsville, NY (US)

( * ) Notice: Subject to any disclaimer, the term of this patent is extended or adjusted under 35 U.S.C. 154(b) by 120 days.

(21) Appl. No.: 13/685,998

(22) Filed: Nov. 27, 2012

(65) Prior Publication Data
US 2014/0145953 A1    May 29, 2014

(51) Int. Cl.
G06F 3/033    (2013.01)
H05K 13/00    (2006.01)
G06F 3/0338    (2013.01)
G06F 3/0354    (2013.01)

(52) U.S. Cl.
CPC ............ G06F 3/033 (2013.01); G06F 3/0338 (2013.01); G06F 3/0354 (2013.01); H05K 13/00 (2013.01); Y10T 29/49002 (2015.01)

(58) Field of Classification Search
CPC .... G06F 3/03549; G06F 3/0312; G06F 1/169; G06F 3/0213; G06F 3/0338; G06F 3/0354
USPC ................................................. 345/156–184
See application file for complete search history.

(56) References Cited

U.S. PATENT DOCUMENTS

| 5,541,622 | A | * | 7/1996 | Engle | G06F 3/0213 345/161 |
| 5,801,371 | A | * | 9/1998 | Kahn et al. | 235/472.01 |
| 6,809,722 | B2 | * | 10/2004 | Mei | G06F 3/03549 345/167 |
| 7,594,548 | B1 | | 9/2009 | Puzio et al. | |
| 7,878,409 | B2 | | 2/2011 | Celestini | |
| 7,934,659 | B2 | | 5/2011 | Schmidt et al. | |
| 2002/0063688 | A1 | * | 5/2002 | Shaw | G06F 3/0312 345/163 |
| 2002/0171625 | A1 | * | 11/2002 | Rothchild | 345/156 |
| 2003/0054883 | A1 | | 3/2003 | Sakiyama | |

(Continued)

FOREIGN PATENT DOCUMENTS

WO    2008057576    5/2008

OTHER PUBLICATIONS

International Search Report and Written Opinion dated Jul. 1, 2013 in counterpart PCT application No. PCT/US2013/068688.

Primary Examiner — Alexander Eisen
Assistant Examiner — Cory A Almeida

(57) ABSTRACT

A mobile device is described. The mobile device includes a housing having a pistol grip portion. A display is coupled to the housing such that the display is viewable by a user of the mobile device when the pistol grip portion is held in a hand of the user. A trigger-like control switch is located on the pistol grip portion of the mobile device. A pointing device is located on the trigger-like control switch such that the pointing device is accessible to an index finger of a hand of the user when the pistol grip portion is held in the hand of the user. The pointing device controls at least one function of the mobile device.

9 Claims, 3 Drawing Sheets

(56) References Cited

U.S. PATENT DOCUMENTS

| | | |
|---|---|---|
| 2004/0046732 A1 | 3/2004 | Chesters |
| 2004/0119693 A1* | 6/2004 | Kaemmler .............. G06F 1/266 |
| | | 345/163 |
| 2007/0091070 A1* | 4/2007 | C. Larsen et al. ............ 345/168 |
| 2007/0159459 A1* | 7/2007 | Wang .................. G06F 3/03547 |
| | | 345/156 |
| 2008/0184112 A1* | 7/2008 | Chiang ............... G06F 3/04817 |
| | | 715/700 |
| 2009/0110839 A1* | 4/2009 | Mather et al. ............. 427/427.2 |
| 2009/0115729 A1* | 5/2009 | Groener et al. ............. 345/167 |
| 2011/0009694 A1* | 1/2011 | Schultz et al. ................ 600/109 |
| 2011/0164164 A1* | 7/2011 | Aoki ...................... G03B 13/02 |
| | | 348/333.01 |
| 2012/0168508 A1 | 7/2012 | Prasad et al. |

\* cited by examiner

INPUT DEVICE ON TRIGGER MECHANISM FOR MOBILE DEVICE

TECHNICAL FIELD

The present disclosure relates generally to input devices for mobile devices.

BACKGROUND

Mobile devices having a gun grip form factor generally use a trigger control which is activated by an index finger of a user to activate a function of the device. For example, a user depressing the trigger control can activate a data capture function of the mobile device.

SUMMARY

In one embodiment, the invention is embodied in a mobile device. The mobile device includes a housing having a pistol grip portion. A display is coupled to the housing such that the display is viewable by a user of the mobile device when the pistol grip portion is held in a hand of the user. A trigger-like control switch is located on the pistol grip portion of the mobile device. A pointing device is located on the trigger-like control switch such that the pointing device is accessible to an index finger of a hand of the user when the pistol grip portion is held in the hand of the user. The pointing device controls at least one function of the mobile device. The function can be a swiping function, a scrolling function, a zoom function, a selection function, a volume function, or a mouse pointing function, for example.

In one embodiment, the trigger-like control switch actuates at least one function of the mobile device. The mobile device can be configured for single handed operation. The pointing device can be a miniature joystick operated by a finger tip, a trackball, a touchpad, and an optical sensor.

The mobile device can also include an imager for capturing images upon activation of the trigger-like control switch. In one embodiment, the display includes a touch screen display. The trigger-like control switch can be a momentary switch. In one embodiment, the trigger-like control switch can be a bifurcated switch for controlling at least two functions of the mobile device.

In another aspect, the invention is embodied in a method for fabricating a mobile device. The method includes forming a housing having a pistol grip portion. A display is coupled to the housing such that the display is viewable by a user of the mobile device when the pistol grip portion is held in a hand of the user. A trigger-like control switch is positioned on the pistol grip portion of the mobile device. A pointing device is located on the trigger-like control switch such that the pointing device is accessible to an index finger of the hand of the user when the pistol grip portion is held in the hand of the user. The pointing device controls a function of the mobile device. The function can be a swiping function, a scrolling function, a zoom function, a selection function, a volume function, or a mouse pointing function, for example.

In one embodiment, the trigger-like control switch actuates at least one function of the mobile device. The trigger-like control switch can be a momentary switch. The trigger-like control switch can include a bifurcated switch for controlling at least two functions of the mobile device. The mobile device can be configured for single hand control. The pointing device can include a miniature joystick operated by a finger tip, a trackball, a touchpad, and an optical sensor.

In one embodiment, an imager can be coupled to the housing. The imager captures images upon activation of the trigger-like control switch. The display can embody a touch screen display.

BRIEF DESCRIPTION OF THE FIGURES

Skilled artisans will appreciate that elements in the figures are illustrated for simplicity and clarity and have not necessarily been drawn to scale. For example, the dimensions of some of the elements in the figures may be exaggerated relative to other elements to help improve understanding of various embodiments. In addition, the description and drawings do not necessarily require the order illustrated. It will be further appreciated that certain actions and/or steps may be described or depicted in a particular order of occurrence while those skilled in the art will understand that such specificity with respect to sequence is not actually required. Apparatus and method components have been represented where appropriate by conventional symbols in the drawings, showing only those specific details that are pertinent to understanding the various embodiments so as not to obscure the disclosure with details that will be readily apparent to those of ordinary skill in the art having the benefit of the description herein. Thus, it will be appreciated that for simplicity and clarity of illustration, common and well-understood elements that are useful or necessary in a commercially feasible embodiment may not be depicted in order to facilitate a less obstructed view of these various embodiments.

The above and further advantages of this invention may be better understood by referring to the following description in conjunction with the accompanying drawings, in which like numerals indicate like structural elements and features in various figures. Skilled artisans will appreciate that reference designators shown herein in parenthesis indicate components shown in a figure other than the one in discussion. For example, talking about a device (10) while discussing Figure A would refer to an element, 10, shown in figure other than Figure A.

DETAILED DESCRIPTION

The following detailed description is merely illustrative in nature and is not intended to limit the invention or the application and uses of the invention. Furthermore, there is no intention to be bound by any express or implied theory presented in the preceding technical field, background, brief summary or the following detailed description. For the purposes of conciseness, many conventional techniques and principles related to fabricating and using pointing devices, need not, and are not, described in detail herein.

Techniques and technologies may be described herein in terms of functional and/or logical block components and various processing steps. It should be appreciated that such block components may be realized by any number of hardware, software, and/or firmware components configured to perform the specified functions. For example, an embodiment of a system or a component may employ various integrated circuit components, e.g., memory elements, digital signal processing elements, logic elements, look-up tables, or the like, which may carry out a variety of functions under the control of one or more microprocessors or other control devices.

The following description may refer to elements or nodes or features being "connected" or "coupled" together. As used herein, unless expressly stated otherwise, "connected" means that one element/node/feature is directly joined to (or directly communicates with) another element/node/feature, and not necessarily mechanically. Likewise, unless expressly stated otherwise, "coupled" means that one element/node/feature is directly or indirectly joined to (or directly or indirectly communicates with) another element/node/feature, and not necessarily mechanically. The term "exemplary" is used in the sense of "example, instance, or illustration" rather than "model," or "deserving imitation."

Technologies and concepts discussed herein relate to input devices for single-handed operation of mobile devices. The mobile device includes a housing having a pistol grip portion. The mobile device can also include a display coupled to the housing such that the display is viewable by a user of the mobile device when the pistol grip portion is held in a hand of the user. A trigger-like control switch is located on the pistol grip portion of the mobile device. A pointing device is located on the trigger-like control switch such that the pointing device is accessible to an index finger of a hand of the user when the pistol grip portion is held in the hand of the user. The pointing device controls a mouse pointer displayed on the display of the mobile device.

Figure 1:
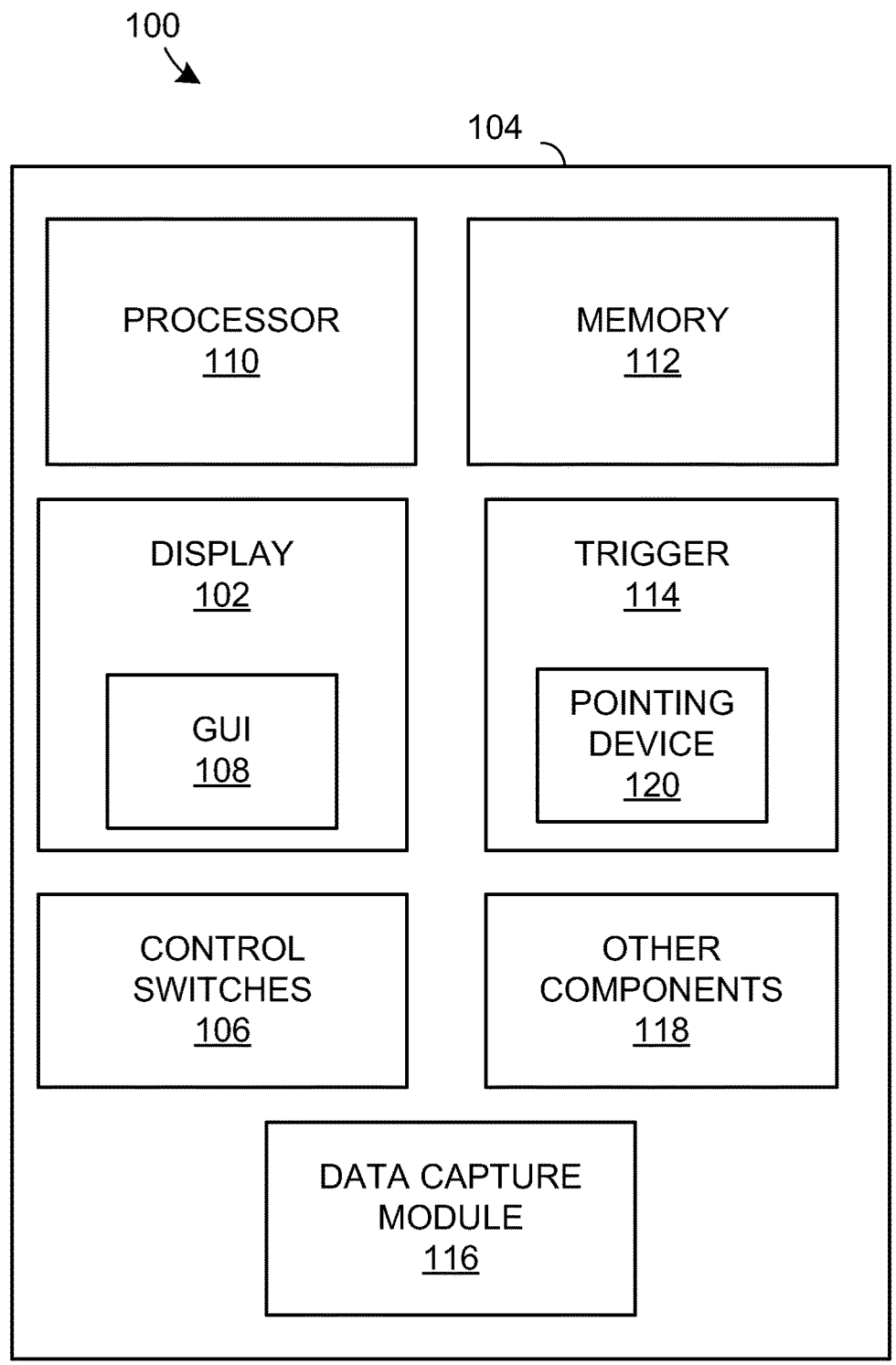
FIG. 1 illustrates a block diagram of the components of a mobile device according to one embodiment of the invention.

FIG. 1 illustrates a block diagram of the components of a mobile device 100 according to one embodiment of the invention. The mobile device 100 includes a display 102 supported by a housing 104. The display 102 can be a liquid crystal display (LCD) including touch screen capability.

The housing 104 can include one or more control switches 106 for controlling different functions of the mobile device 100. The display 102 can display a graphical user interface 108. The GUI 108 can be programmed to activate different functions of the mobile device 100.

The mobile device 100 can also include a processor 110, a memory 112, a trigger-like control 114, a data capture module 116 and other components 118, such as a battery, a, a transceiver, and a motion sensor, for example. The trigger-like control 114 includes an integrated pointing device 120. For example, the pointing device 120 can control a mouse pointer displayed on the display 102 of the mobile device 100. The pointing device 120 can be a miniature joystick operated by a finger tip integrated with the trigger-like control switch 114. The pointing device 120 can be a trackball integrated with the trigger-like control switch 114. The pointing device 120 can be a touchpad integrated with the trigger-like control switch 114. In one embodiment, the pointing device 120 is an optical sensor integrated with the trigger-like control switch 114.

The processor 110 can provide conventional functionalities for the mobile device 100. In a specific example according to the exemplary embodiments of the present invention and as will be described in further detail below, the mobile device 100 can include a plurality of software applications that are executed on the processor 110 such as a software application related to capturing and processing images, documents and video. The memory 112 can also provide conventional functionalities for the mobile device 100. For example, the memory 112 can store data and software applications related to operations performed by the processor 110.

The display 102 can be any component configured to display data to a user. The display 102 can include, for example, a liquid crystal display (LCD) at least partially disposed within the housing 104 of the mobile device 100. The pointing device 120 can be any component configured to receive an input from the user, such as a touch pad. In one embodiment, the trigger-like control switch 114 activates a function selected by a user with the pointing device 120. For example, a user can move a cursor using an index finger to select an icon on the GUI 108 using the pointing device 120. The user then activates the function corresponding to the icon by depressing the trigger-like control switch 114 with the index finger.

A transceiver can provide the mobile device 100 with a method of exchanging data with a communications network. The other components 118 can include additional components conventionally found in electronic devices, such as a battery, charging circuitry and one or more antennas, for example.

The data capture module 116 can include an imager. The imager can be any component configured to capture image data. For example, the imager can include any type of image sensor or sensors. The imager can capture an image in a field of view (FoV) of the imager. In one embodiment, the image captured in the FoV of the imager can be displayed on the display 102. In one embodiment, an image displayed on the display 102 can be manipulated using the pointing device 120. For example, the pointing device 120 can be programmed to zoom in or out or pan around the displayed image in response to a user input.

As previously described, the display 102 can include a touch screen to enable the user to enter inputs directly on the touch screen. The processor 110 can generate the graphical user interface (GUI) 108 on the display 102 to provide icons corresponding to certain functionality of the mobile device 100.

Figure 2:
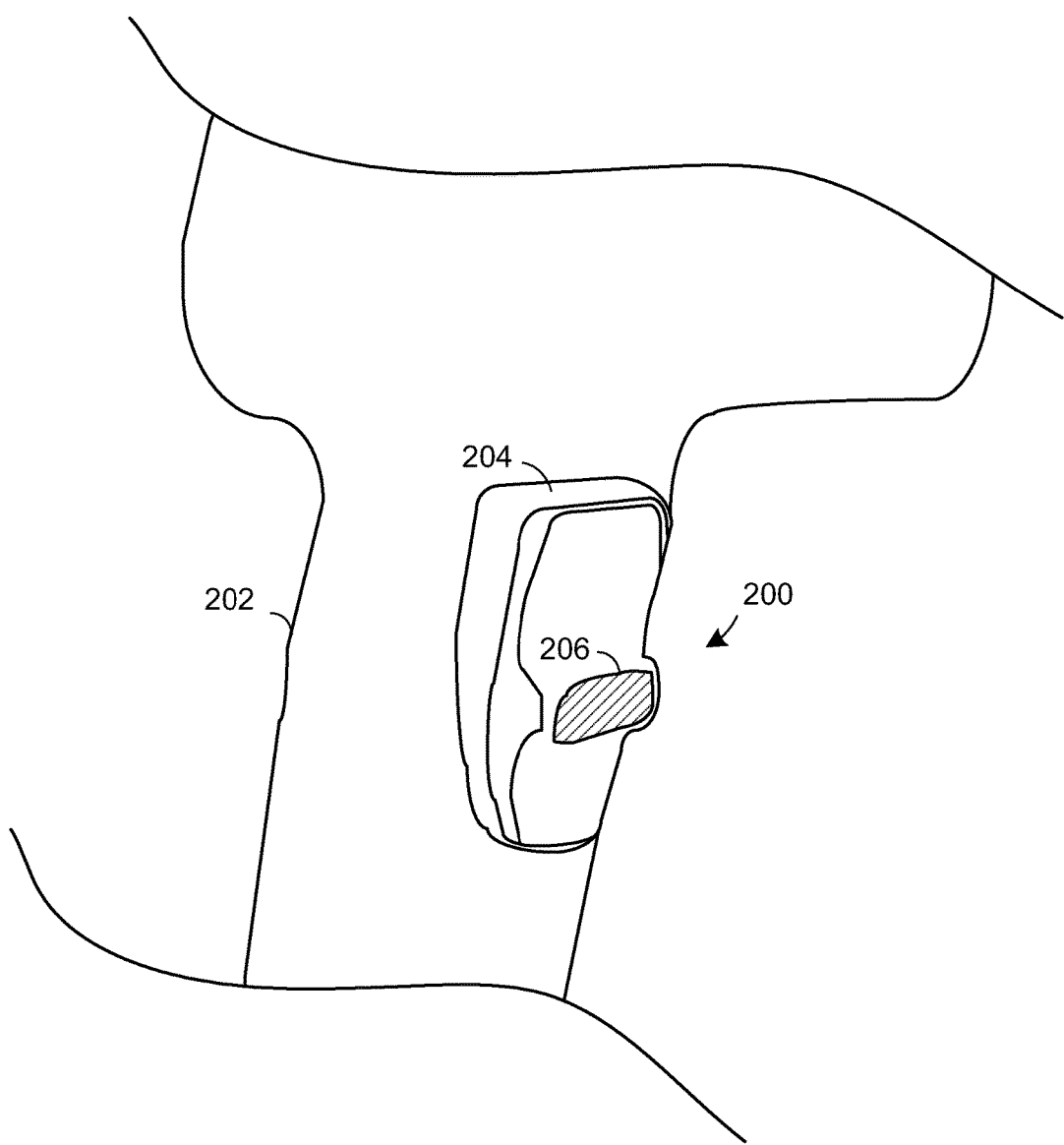
FIG. 2 illustrates an exemplary trigger assembly according to the invention.

FIG. 2 illustrates an exemplary trigger assembly 200 according to the invention. The trigger assembly 200 is supported by a housing 202. The trigger assembly 200 includes a trigger-like control switch 204 and a pointing device 206. The pointing device 206 can control a mouse pointer displayed on a display 102 (FIG. 1) of the mobile device 100. The pointing device 206 can be a miniature joystick operated by a finger tip, such as a pointing stick, a trackball, a touchpad device, or an optical sensor integrated with the trigger-like control switch 204. In practice, any suitable pointing device can be used.

In one embodiment, the pointing device is a touchpad. A touchpad operates by capacitive sensing or conductance sensing. For example, a touchpad can sense the capacitive virtual ground effect of a finger, or the capacitance between sensors. When a finger is placed on the touchpad, capacitance on the sensors changes and is detected by the sensors. The sensor signals are processed by electronic circuits to indicate a pointer position or a change of pointer position. The touchpad can sense absolute position. For example, the touchpad can sense the dragging motion of a finger which is translated into a finer, relative motion of the cursor on the display 102.

In one embodiment, the pointing device is a trackball. A trackball is an inverted mouse. The trackball can control movement of a cursor on the display. The trackball or rollerball includes a system of directional roller sensors inside a housing that are in contact with the exposed trackball. A movement of the trackball translates the directional roller sensors which determine what direction to move the cursor on the display.

In one embodiment, the pointing device is a miniature joystick, such as a pointing stick. A pointing stick is an isometric joystick used as a pointing device. The pointing stick operates by sensing applied force to a pair of resistive strain gauges. The strain gauges can detect a pointer position or a change of pointer position. The velocity of the moving cursor depends on the applied force to the pointing stick.

In one embodiment, the pointing device is an optical sensor. The optical sensor can use a light-emitting diode and photodiodes to detect movement of a finger relative to an optical window of the optical sensor. In one embodiment, the optical sensor is an optoelectronic sensor, such as a small low-resolution video camera, to take successive images of the finger as it moves across the optical window. Image processing chips coupled to the optoelectronic sensor can detect relative motion of the finger, thereby translating the movement of the finger into the movement of the cursor on the display 102.

Figure 3:
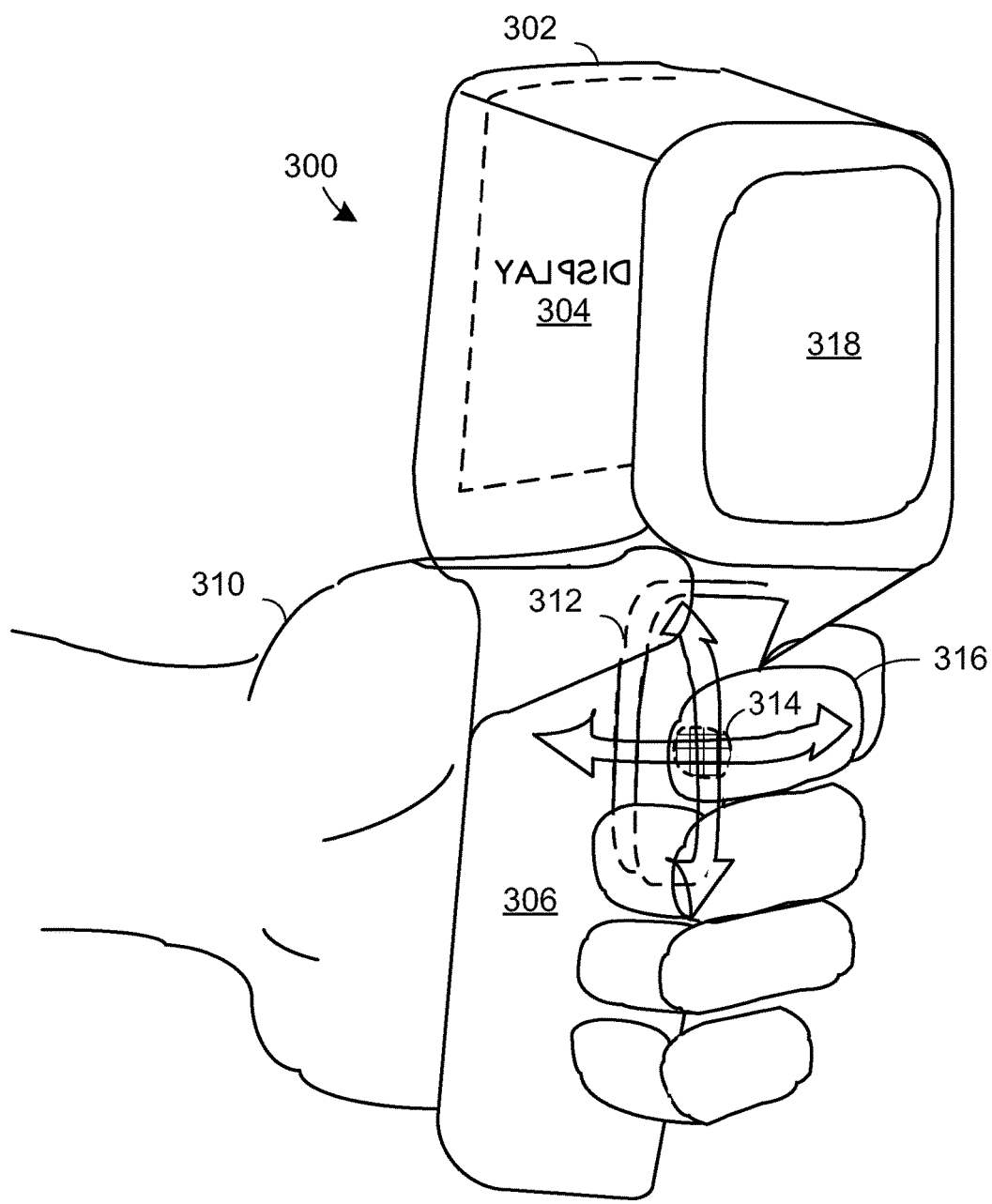
FIG. 3 illustrates the mobile device in operation according to one embodiment of the invention.

FIG. 3 illustrates the mobile device 300 in operation according to one embodiment of the invention. The mobile device 300 includes a housing 302 supporting a display 304 that is viewable to a user operating the mobile device 300. The display 304 can be a touch screen display. The housing 302 includes a handle portion 306 in the shape of a pistol grip. The pistol grip is configured to be held in a hand 310 of a user. A trigger-like control switch 312 is located on the pistol grip portion of the mobile device 300.

A pointing device 314 is located on the trigger-like control switch 312 such that the pointing device 314 is accessible to an index finger 316 of the hand 310 of the user when the pistol grip portion 306 is held in the hand 310 of the user. The pointing device 314 controls a mouse pointer or cursor displayed on the display 304 of the mobile device 300. The cursor controlled by the pointing device 314 is responsive to a movement of the index finger 316. The use of the index finger 316 is only exemplary. In practice, any suitable finger can be used.

In other embodiments, the pointing device 314 can control other functions of the mobile device 300 in addition to a mouse pointing function. For example, the pointing device 314 can be used to scroll through windows or images displayed on the display 304 using a swiping technique. In another example, the pointing device 314 can be used to magnify an image on the display 304 using a zoom function. The function of the pointing device 314 can then be altered to move the magnified image within the display 304.

In one embodiment, the pointing device 314 can be used to position a bounding box over an area of interest displayed on the display 304. For example, the bounding box can be used to highlight an object among a plurality of objects displayed on the display 304. The trigger-like control switch 312 can then select the highlighted object.

The pointing device 314 can be used to control a volume function of the mobile device 300. The pointing device 314 can be used to control brightness and/or contrast of the display 304 of the mobile device 300. In practice, any suitable function can be controlled using the pointing device 314.

In one embodiment, the trigger-like control switch 312 can be a momentary switch. In one embodiment, the trigger-like control switch 312 can correspond to a "left-click" selection control of the pointing device 314.

Alternatively, the trigger-like control switch 312 can be a "toggle" switch for continuous "on" or "off" operation. The trigger-like control switch 312 can be a bifurcated switch (not shown) for controlling two or more functions of the mobile device 300. In one example, a bifurcated switch can have a top switch that corresponds to a "left-click" of the pointing device 314 and a bottom switch that corresponds to a "right-click" of the pointing device 314.

In one embodiment, the mobile device 300 can be fabricated by forming the housing 302 having the pistol grip portion 306. The display 304 is coupled to the housing 302 such that the display 304 is viewable by a user of the mobile device 300 when the pistol grip portion 306 is held in the hand 310 of the user. The trigger-like control switch 312 is positioned on the pistol grip portion 306 of the mobile device 300. The pointing device 314 is located on the trigger-like control switch 312 such that the pointing device 314 is accessible to the index finger 316 of the hand 310 of the user when the pistol grip portion 306 is held in the hand 310 of the user. The pointing device 314 controls a mouse pointer displayed on the display 304 of the mobile device 300.

In one embodiment, the trigger-like control switch 314 actuates at least one function of the mobile device 300. For example, the trigger-like control switch 314 can activate a data capture function of the mobile device 300. In another embodiment, the trigger-like control switch 312 can select an option highlighted by a cursor viewable on the display 304 that is controlled by the pointing device 314. In one embodiment, the mobile device 300 is configured for single hand control.

As previously described, the pointing device 314 can be a miniature joystick operated by a finger tip, a trackball, a touchpad or an optical sensor integrated with the trigger-like control switch 312.

A data capture module 318, such as an imager, can be coupled to the housing 302. The imager can capture images upon activation of the trigger-like control switch 312. Alternatively, the data capture module 318 can be a radio-frequency identification (RFID) reader/writer.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the methods and apparatus described herein. The non-processor circuits may include, but are not limited to, a radio receiver, a radio transmitter, signal drivers, clock circuits, power source circuits, and user input devices. As such, these functions may be interpreted as steps of a method described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used. Both the state machine and ASIC are considered herein as a "processing device" for purposes of the foregoing discussion and claim language.

Moreover, an embodiment can be implemented as a computer-readable storage element or medium having computer readable code stored thereon for programming a computer (e.g., comprising a processing device) to perform a method as described and claimed herein. Examples of such computer-readable storage elements include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less all features of a single disclosed embodiment. Thus the following claims are hereby incorporated into the Detailed Description, with each claim standing on its own as a separately claimed subject matter.

While at least one example embodiment has been presented in the foregoing detailed description, it should be appreciated that a vast number of variations exist. It should also be appreciated that the example embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

In addition, the section headings included herein are intended to facilitate a review but are not intended to limit the scope of the present invention. Accordingly, the specification and drawings are to be regarded in an illustrative manner and are not intended to limit the scope of the appended claims.

In interpreting the appended claims, it should be understood that:

a) the word "comprising" does not exclude the presence of other elements or acts than those listed in a given claim;

b) the word "a" or "an" preceding an element does not exclude the presence of a plurality of such elements;

c) any reference signs in the claims do not limit their scope;

d) several "means" may be represented by the same item or hardware or software implemented structure or function;

e) any of the disclosed elements may be comprised of hardware portions (e.g., including discrete and integrated electronic circuitry), software portions (e.g., computer programming), and any combination thereof;

f) hardware portions may be comprised of one or both of analog and digital portions;

g) any of the disclosed devices or portions thereof may be combined together or separated into further portions unless specifically stated otherwise; and h) no specific sequence of acts or steps is intended to be required unless specifically indicated.

What is claimed is:

1. A mobile device, comprising:
a housing having a pistol grip portion;
a display coupled to the housing such that the display is viewable by a user of the mobile device;
a trigger-like control switch located on the pistol grip portion of the mobile device, the trigger-like control switch shaped as a trigger accessible and operable by a user's index finger to actuate a function of the mobile device; and
a pointing device integrated within a housing of the trigger-like control switch, the housing of the trigger-like control switch integrated within the housing having the pistol grip portion, such that the pointing device is accessible and operable by the user's index finger when the pistol grip portion is held in the hand of the user, the pointing device coupled to the display and operable by the user's index finger to select an operational parameter of the function on the display, whereupon depressing of the control switch by the user's index finger actuates the function of the mobile device in accordance with the operational parameter, wherein,
the pointing device is operable to specify a position of a bounding box over an area of an image displayed on the display to highlight an object among a plurality of objects displayed in the image on the display, whereupon the trigger-like control switch is operable to select the highlighted object and activate a data capture function for the selected object.

2. The mobile device of claim 1, wherein the display is operable to display icons corresponding to functions of the mobile device, the pointing device is operable by the user's index finger to move a cursor to select an icon representing a function on the display to highlight, whereupon the trigger-like control switch is operable by being depressed by the user's index finger to actuate the function of the mobile device corresponding to the highlighted icon on the display.

3. The mobile device of claim 2, wherein the pointing device comprises a miniature joystick operated by the index finger, wherein the cursor moves with a velocity dependent upon a force applied to the joystick.

4. The mobile device of claim 1, wherein the pointing device is operable to scroll through window images on the display.

5. The mobile device of claim 1, wherein the pointing device comprises a touchpad integrated with the trigger-like control switch.

6. The mobile device of claim 1, wherein the display displays an image, and further comprising an imager for capturing the image upon actuation of the trigger-like control switch, and wherein the pointing device controls an operational parameter of the image.

7. The mobile device of claim 6, wherein the operational parameter controlled by the pointing device is a zoom parameter of the image.

8. The mobile device of claim 6, wherein the operational parameter controlled by the pointing device is a pan parameter of the image.

9. A method for a mobile device, comprising:
forming a housing having a pistol grip portion;
coupling a display to the housing such that the display is viewable by a user of the mobile device when the pistol grip portion is held in a hand of the user;
positioning a trigger-like control switch on the pistol grip portion of the mobile device; and
integrating a pointing device within a housing of the trigger-like control switch, the housing of the trigger-like control switch integrated within the housing having the pistol grip portion, such that the pointing device is accessible and operable by a user's index finger when the pistol grip portion is held in the hand of the user, the pointing device operable by the index finger to control an operational parameter of a function on the display, wherein
the pointing device is configured to select by the index finger the operational parameter of the function of the mobile device and specify a position of a bounding box over an area of an image displayed on the display to highlight an object among a plurality of objects displayed in the image on the display, whereupon the trigger-like control switch is shaped as a trigger and configured to select, by the index finger depressing the control switch, the highlighted object and activate a data capture function for the selected object in accordance with the operational parameter.

* * * * *